United States Patent
Chang et al.

(10) Patent No.: US 8,346,200 B2
(45) Date of Patent: Jan. 1, 2013

(54) LOW-NOISE BLOCK

(75) Inventors: Kuo Tien Chang, Hsinchu (TW); Jia Lun Chen, Hsinchu (TW)

(73) Assignee: Microelectronics Technology Inc., Hsinchu (TW)

( * ) Notice: Subject to any disclaimer, the term of this patent is extended or adjusted under 35 U.S.C. 154(b) by 928 days.

(21) Appl. No.: 12/178,227

(22) Filed: Jul. 23, 2008

(65) Prior Publication Data

US 2009/0163169 A1 Jun. 25, 2009

(30) Foreign Application Priority Data

Dec. 21, 2007 (TW) .............................. 96221796 U

(51) Int. Cl.
*H04B 1/26* (2006.01)
(52) U.S. Cl. ........................ 455/313; 455/323
(58) Field of Classification Search .......... 455/313–323, 455/3.02–3.06
See application file for complete search history.

(56) References Cited

U.S. PATENT DOCUMENTS

| 6,218,904 | B1 | 4/2001 | Panther | |
|---|---|---|---|---|
| 6,931,245 | B2* | 8/2005 | Fikart | 455/323 |
| 2003/0091038 | A1* | 5/2003 | Hagedorn | 370/359 |
| 2004/0192190 | A1 | 9/2004 | Motoyama | |
| 2007/0129038 | A1* | 6/2007 | Ragan et al. | 455/226.4 |
| 2007/0238436 | A1* | 10/2007 | Motoyama | 455/313 |
| 2007/0253177 | A1* | 11/2007 | Nibe | 361/763 |

FOREIGN PATENT DOCUMENTS

EP  1089469 A1  4/2001

OTHER PUBLICATIONS

European Search Report dated May 12, 2010 from the corresponding European application.

* cited by examiner

*Primary Examiner* — Lana N Le
(74) *Attorney, Agent, or Firm* — WPAT, P.C.; Anthony King

(57) ABSTRACT

A low-noise block converter comprises a low-noise amplifier, a local oscillator, a mixer, an IF-amplifier and a regulator. The low-noise amplifier amplifies a high-band received signal. The local oscillator generates a local-frequency signal. The mixer transforms the high-band received signal into an intermediate-frequency signal by mixing the high-band received signal with the generated local-frequency signal. The IF-amplifier amplifies the intermediate-frequency signal. The regulator is connected to the IF-amplifier to provide a steady current (or voltage) to the local oscillator, the mixer and the low-noise amplifier.

18 Claims, 5 Drawing Sheets

LOW-NOISE BLOCK

BACKGROUND OF THE INVENTION (A) Field of the Invention

The present invention relates to a low-noise block, and more particularly, to a low-noise block with low current.

(B) Description of the Related Art

When transmitting in a cable, the higher the frequency a signal has, the more severe it degrades. To prevent satellite signals, which are high frequency signals, from degrading, ordinarily there should be a low-noise block at the receiver of a satellite system. The low-noise block down-converts satellite signals into intermediate-frequency signals to maintain the quality of the transmission signal for the following process.

FIG. 1 shows a block diagram of a conventional low-noise block. The low-noise block 101 comprises a low-noise amplifier 102, a local oscillator 103, a mixer 104, an IF-amplifier 105, a regulator 106, a radio-frequency (RF) choke L1, and capacitances C1 to C3. The low-noise amplifier 102 amplifies a received high-band signal. The local oscillator 103 generates a local-frequency signal. The mixer 104 mixes the local-frequency signal and the received high-band signal into an intermediate-frequency signal. The IF-amplifier 105 amplifies the intermediate-frequency signal. The regulator 106 is coupled to the low-noise amplifier 102, the local oscillator 103 and the IF-amplifier 105 to provide a regular voltage to the low-noise amplifier 102, the local oscillator 103, the mixer 104 and the IF-amplifier 105. The capacitances C1 to C3 filter out the AC component from the passing current. The capacitance C1 is coupled to the voltage input of the low-noise amplifier 102 and ground. The capacitance C2 is coupled to the voltage input of the local oscillator 103 and ground. The capacitance C3 is coupled to the voltage input of the IF-amplifier 105 and ground.

As shown in FIG. 1, the regulator 106 simultaneously provides current to the low-noise amplifier 102, the local oscillator 103, the mixer 104 and the IF-amplifier 105. The total current of the three paths is significant. Therefore, there is a need to design a low-noise block with low current.

SUMMARY OF THE INVENTION

The first embodiment of the present invention is a low-noise block comprising a low-noise amplifier, a local oscillator, a mixer, an IF-amplifier and a regulator. The low-noise amplifier amplifies a received high-band signal. The local oscillator generates a local-frequency signal. The mixer mixes the local-frequency signal and the high-band received signal into an intermediate-frequency signal. The IF-amplifier amplifies the intermediate-frequency signal. The regulator is coupled to the IF-amplifier to provide a regular voltage or current to the low-noise amplifier and the local oscillator.

The second embodiment of the present invention is a low-noise block comprising a low-noise amplifier, a local oscillator, a mixer, an IF-amplifier and a regulator. The low-noise amplifier amplifies a high-band received signal. The local oscillator generates a local-frequency signal. The mixer mixes the local-frequency signal and the high-band received signal into an intermediate-frequency signal. The IF-amplifier amplifies the intermediate-frequency signal. The regulator is coupled to the low-noise amplifier to provide a regular voltage or current to the IF-amplifier and the local oscillator.

The third embodiment of the present invention is a low-noise block with multiple outputs comprising a switch circuit, a first low-noise block according to the first embodiment and a second low-noise block according to the first embodiment. The first low-noise block receives the vertical phase component of the input signal. The second low-noise block receives the horizontal phase component of the input signal. The switch circuit is coupled to the outputs of the first low-noise block and the second low-noise block to provide an output signal.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
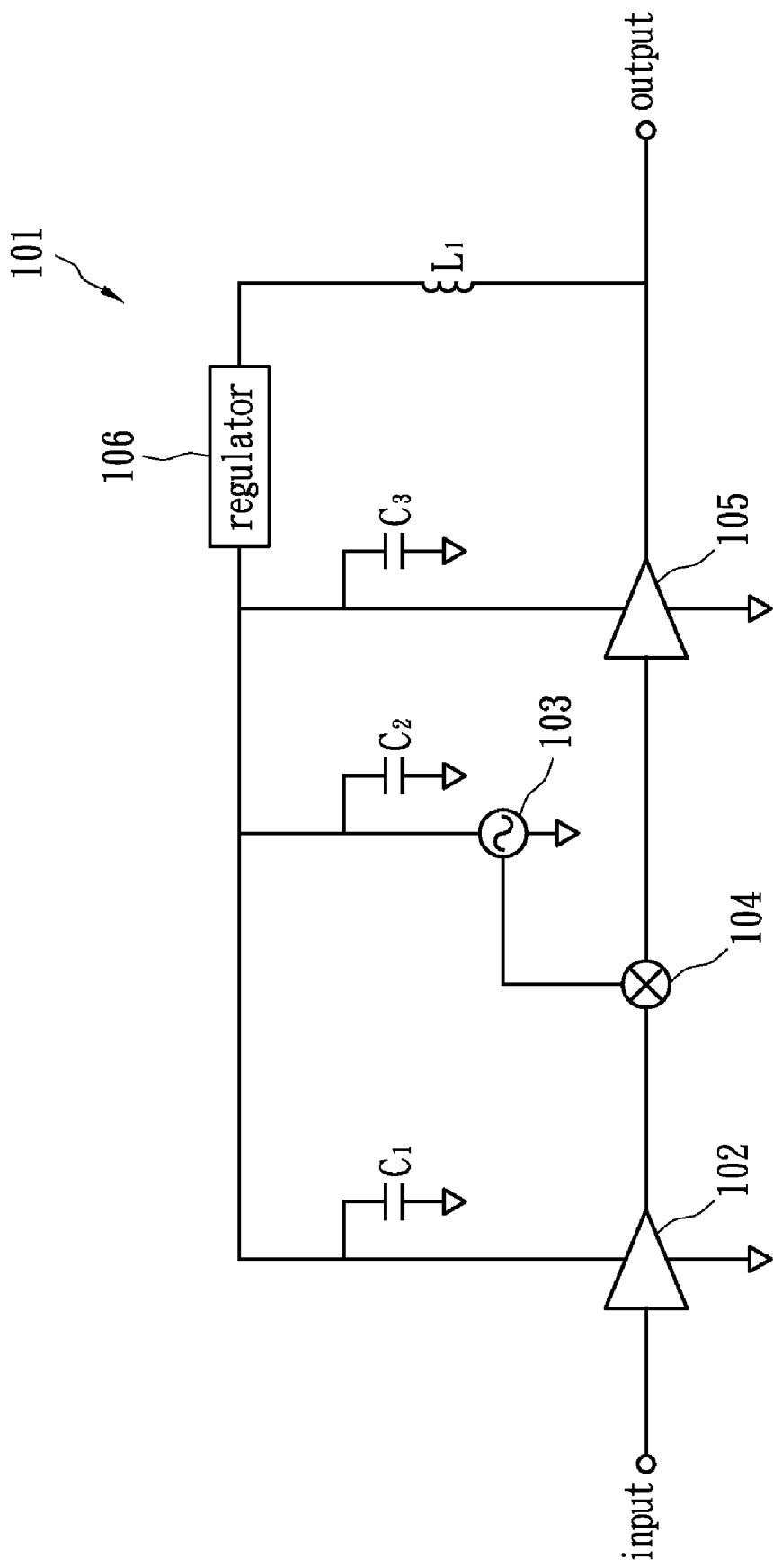
FIG. 1 shows a block diagram of a conventional low-noise block.
Figure 2:
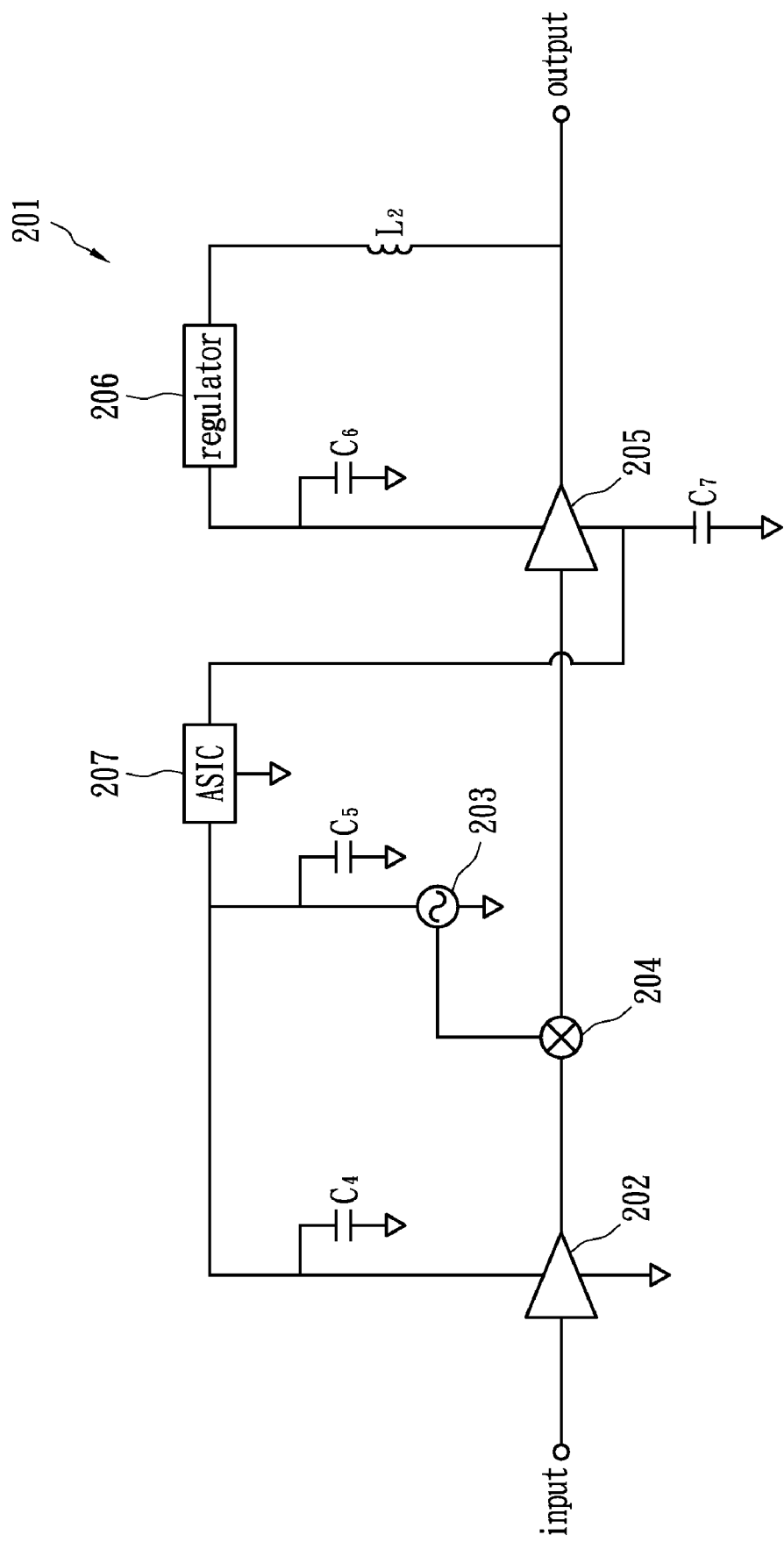
FIG. 2 shows a block diagram of a low-noise block of the first embodiment of the present invention.

FIG. 2 shows a block diagram of a low-noise block of the first embodiment of the present invention. The low-noise block 201 comprises a low-noise amplifier 202, a local oscillator 203, a mixer 204, an IF-amplifier 205, a regulator 206, a radio-frequency (RF) choke L2, and capacitances C4 to C7. The low-noise amplifier 202 amplifies a received high-band signal. The local oscillator 203 generates a local-frequency signal. The mixer 204 mixes the local-frequency signal and the high-band received signal into an intermediate-frequency signal. The IF-amplifier 205 amplifies the intermediate-frequency signal. The regulator 206 is coupled to the IF-amplifier 205, and, accordingly, the IF-amplifier 205 provides a regular voltage or current to the low-noise amplifier 202 and the local oscillator 203.

The RF choke L2 is coupled to the input port of the regulator 206 and the output port of the IF-amplifier 205. The capacitances C4 to C7 filter out the AC component from the passing current. The capacitance C4 is coupled to the voltage input of the low-noise amplifier 202 and ground. The capacitance C5 is coupled to the voltage input of the local oscillator 203 and ground. The capacitance C6 is coupled to the voltage input of the IF-amplifier 205 and ground. The capacitance C7 is coupled to the voltage output of the IF-amplifier 205 and ground.

As shown in FIG. 2, the low-noise block 201 reconnects the parallel circuit formed by the low-noise amplifier 102, the local oscillator 103 and the IF-amplifier 105 of the low-noise block 101 into a serial circuit formed by the IF-amplifier 205 and a parallel circuit formed by the low-noise amplifier 202 and the local oscillator 203. In other words, the current passing through the IF-amplifier 205 will not flow to ground, but will rather flow to the parallel circuit formed by the low-noise amplifier 202 and the local oscillator 203, and thus the current being used is reduced. The capacitance C7 filters out the AC component from the output current of the IF-amplifier 205 to provide a DC current to the low-noise amplifier 202, the local oscillator 203 and the mixer 204. The RF choke L2 filters out the AC component from the input current of the regulator 206. Preferably, an application-specific integrated circuit (ASIC) 207 may be connected between IF-amplifier 205 and the parallel circuit formed by the low-noise amplifier 202 and the local oscillator 203 to provide a constant bias voltage to the low-noise amplifier 202, the local oscillator 203.

Figure 3:
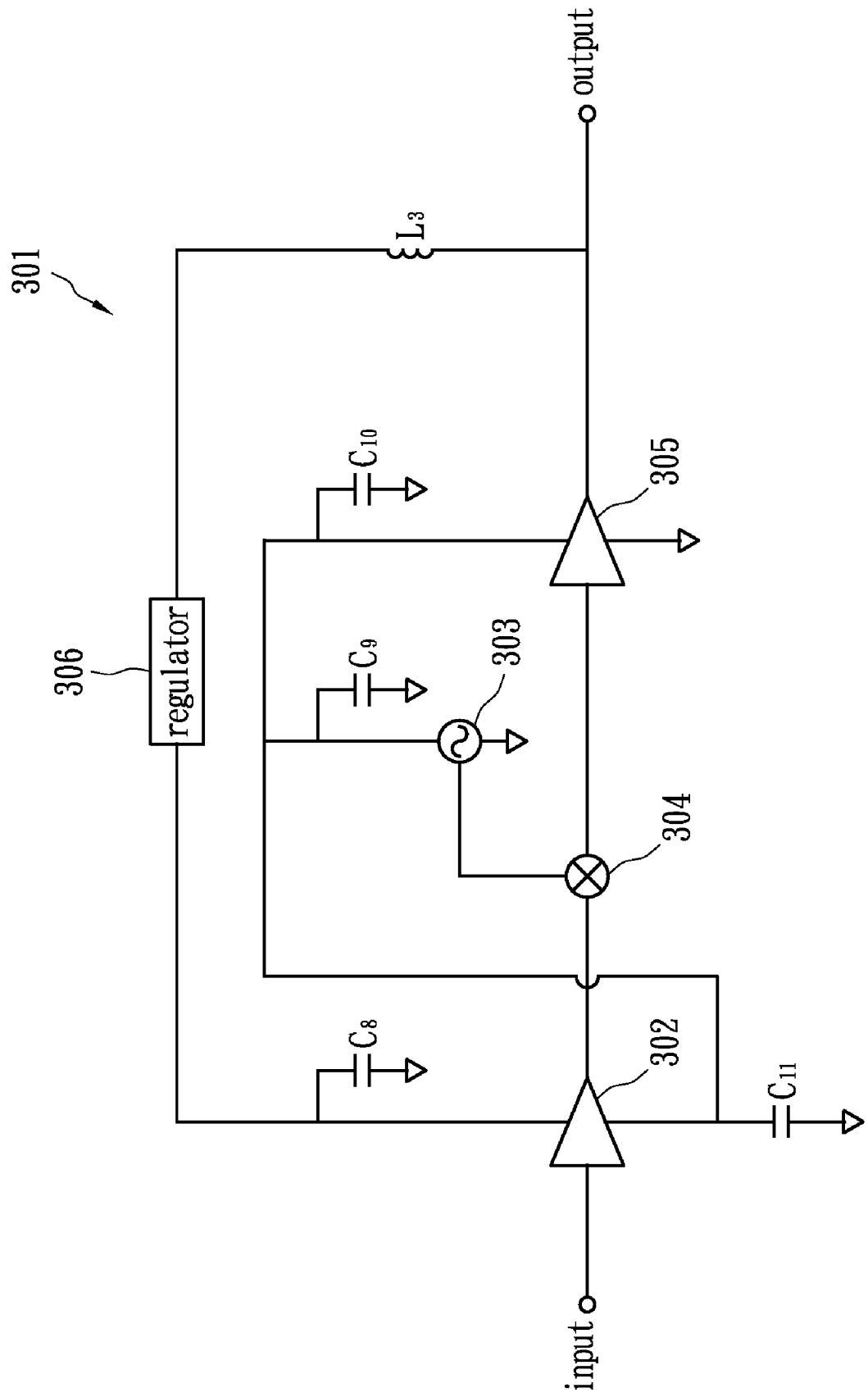
FIG. 3 shows a block diagram of a low-noise block of the second embodiment of the present invention.

FIG. 3 shows a block diagram of a low-noise block of the second embodiment of the present invention. The low-noise block 301 comprises a low-noise amplifier 302, a local oscillator 303, a mixer 304, an IF-amplifier 305, a regulator 306, a radio-frequency (RF) choke L3, and capacitances C8 to C11. The low-noise amplifier 302 amplifies a received high-band signal. The local oscillator 303 generates a local-frequency signal. The mixer 304 mixes the local-frequency signal and the high-band received signal into an intermediate-frequency signal. The IF-amplifier 305 amplifies the intermediate-frequency signal. The regulator 306 is coupled to the low-noise amplifier 302, whose voltage output is coupled to the local oscillator 303 and the IF-amplifier 305. The RF choke L2 is coupled to the input port of the regulator 306 and the output port of the IF-amplifier 305. The capacitances C8 to C11 filter out the AC component from the passing current. The capacitance C8 is coupled to the voltage input of the low-noise amplifier 302 and ground. The capacitance C9 is coupled to the voltage input of the local oscillator 303 and ground. The capacitance C10 is coupled to the voltage input of the IF-amplifier 305 and ground. The capacitance C11 is coupled to the voltage output of the low-noise amplifier 302 and ground.

As shown in FIG. 3, the structure of the serial circuit of the low-noise block 301 is modified from that of the low-noise block 201. However, the serial circuit formed by the low-noise amplifier 302 and the parallel circuit formed by the IF-amplifier 305 and the local oscillator 303 can also share the current being used. The capacitance C11 serves a similar function as the capacitance C7, filtering out the AC component from the output current of the low-noise amplifier 302 to provide a DC current to the local oscillator 303 and the IF-amplifier 305. The RF choke L3 filters out the AC component from the input current of the regulator 306.

The low-noise blocks 201 and 301 may each comprise more than one local oscillator to generate local-frequency signals of different frequencies. Accordingly, the low-noise blocks 201 and 301 may each comprise more than one mixer and IF-amplifier to generate and amplify more than one intermediate-frequency signal. The low-noise blocks 201 and 301 also may each comprise more than one regulator to provide more than one output port.

Figure 4:
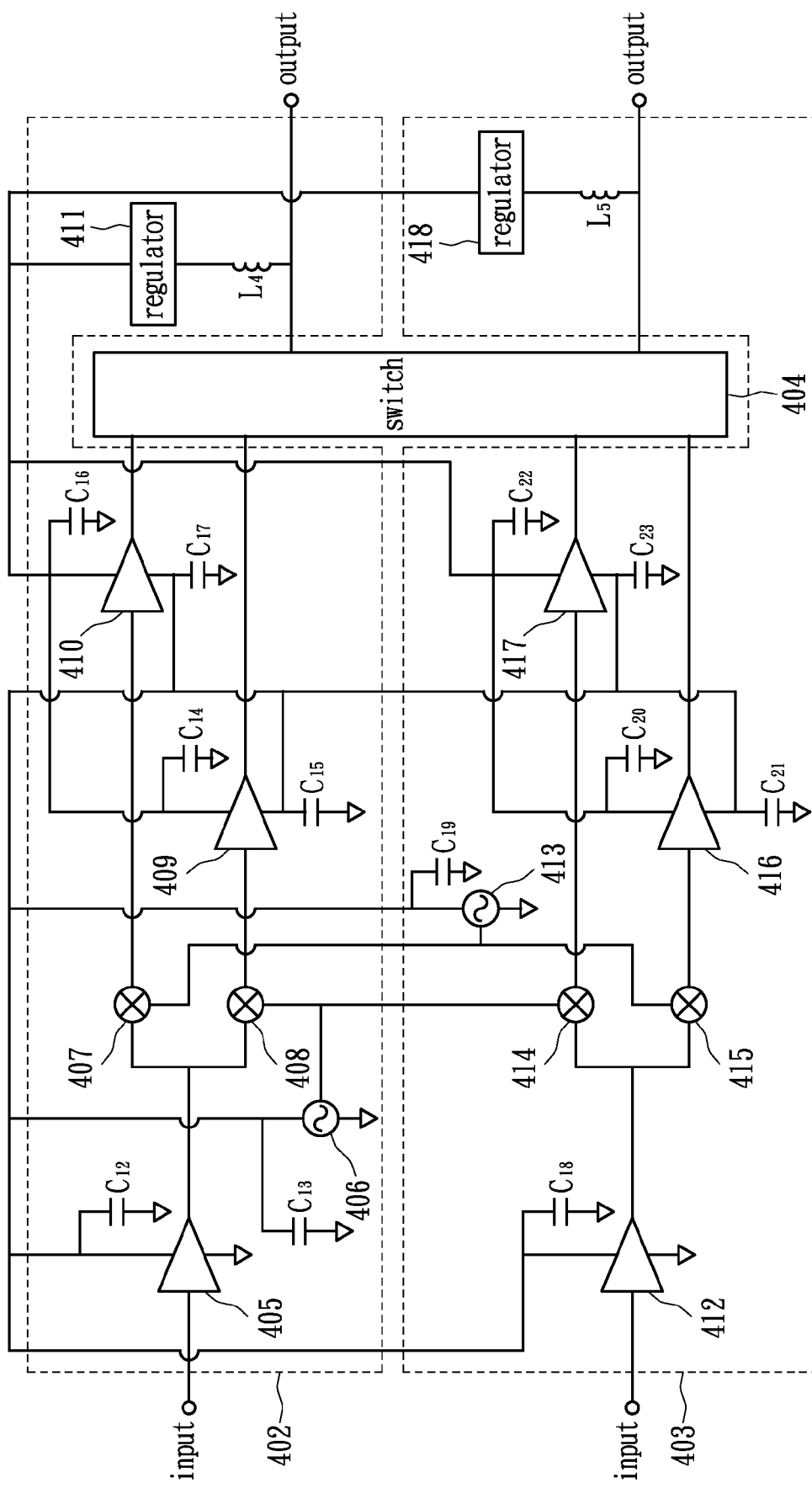
FIG. 4 shows a block diagram of a low-noise block of the third embodiment of the present invention.

FIG. 4 shows a block diagram of a low-noise block comprising two outputs of the third embodiment of the present invention. The two-output low-noise block 401 comprises a first low-noise block 402 according to the first embodiment, a second low-noise block 403 according to the first embodiment and a four by two (four input two output) switch 404. The first low-noise block 402 comprises a first low-noise amplifier 405, a first local oscillator 406, a first mixer 407, a second mixer 408, a first IF-amplifier 409, a second IF-amplifier 410 and a first regulator 411. The second low-noise block 403 comprises a second low-noise amplifier 412, a second local oscillator 413, a third mixer 414, a fourth mixer 415, a third IF-amplifier 416, a fourth IF-amplifier 417 and a second regulator 418. The first low-noise block 402 receives the vertical phase component of the input signal. The second low-noise block 403 receives the horizontal phase component of the input signal. The input port of the four by two switch 404 is coupled to the output ports of the first IF-amplifier 409, the second IF-amplifier 410, the third IF-amplifier 416 and the fourth IF-amplifier 417 to provide the output signal of the two-output low-noise block 401.

Figure 5:
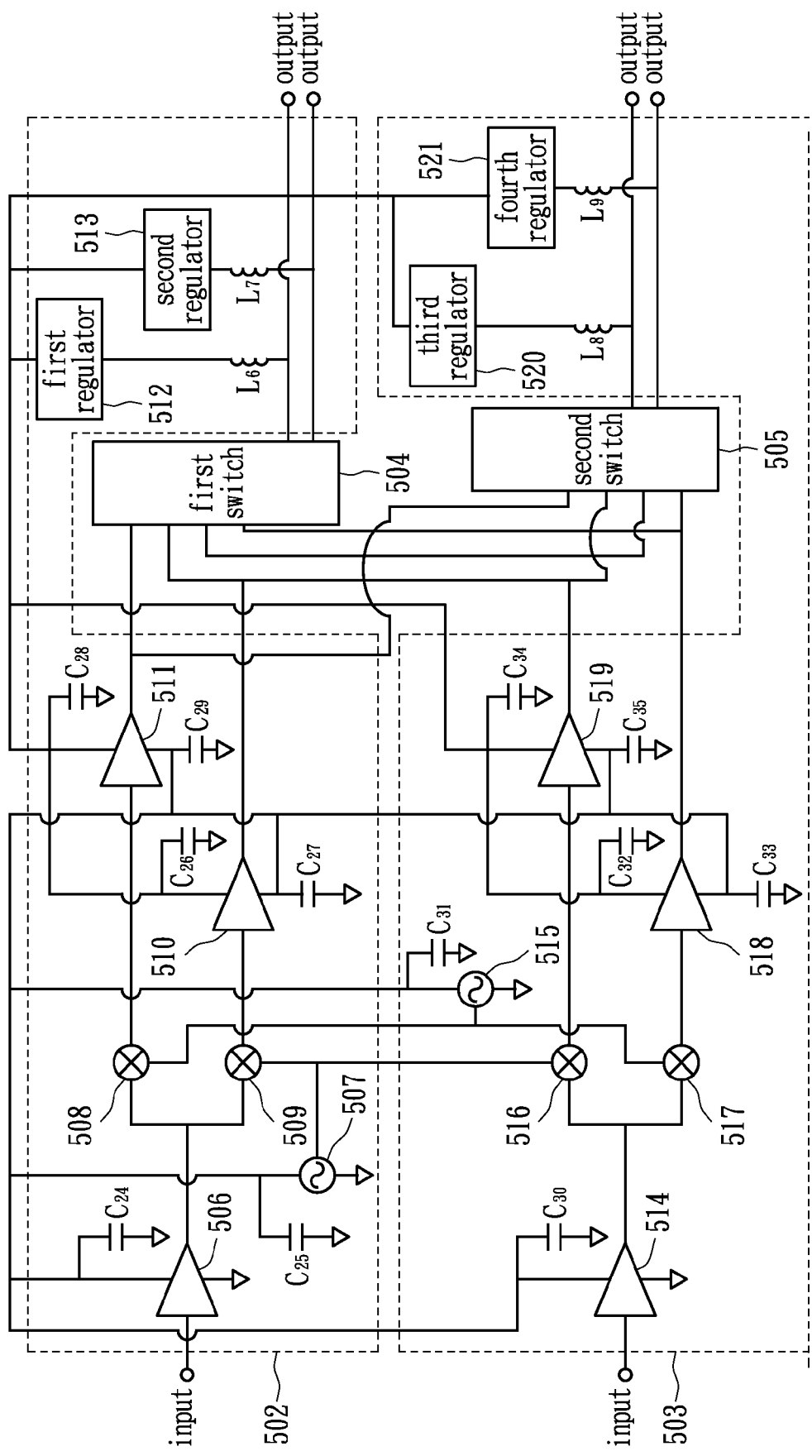
FIG. 5 shows a block diagram of a low-noise block of the fourth embodiment of the present invention.

FIG. 5 shows a block diagram of a low-noise block comprising four outputs of the fourth embodiment of the present invention. The four-output low-noise block 501 comprises a first low-noise block 502 according to the first embodiment, a second low-noise block 503 according to the first embodiment, a first four by two switch 504 and a second four by two switch 505. The first low-noise block 502 comprises a first low-noise amplifier 506, a first local oscillator 507, a first mixer 508, a second mixer 509, a first IF-amplifier 510, a second IF-amplifier 511, a first regulator 512 and a second regulator 513. The second low-noise block 503 comprises a second low-noise amplifier 514, a second local oscillator 515, a third mixer 516, a fourth mixer 517, a third IF-amplifier 518, a fourth IF-amplifier 519, a third regulator 520 and a fourth regulator 521. The first low-noise block 502 receives the vertical phase component of the input signal. The second low-noise block 503 receives the horizontal phase component of the input signal. The input port of the first four by two switch 504 is coupled to the output ports of the first IF-amplifier 510, the second IF-amplifier 511, the third IF-amplifier 518 and the fourth IF-amplifier 519 to provide the output signals of the four-output low-noise block 501. The input port of the second four by two switch 505 is coupled to the output ports of the first IF-amplifier 510, the second IF-amplifier 511, the third IF-amplifier 518 and the fourth IF-amplifier 519 to provide the output signals of the four-output low-noise block 501.

As can be seen in FIG. 4 and FIG. 5, the low-noise block of the present invention can be combined with switches or any other available way to form a multiple-output low-noise block, but is not limited by the embodiments in FIG. 4 and FIG. 5.

The low-noise block of the present invention can efficiently reduce the current used, and therefore the usage of a DC-DC regulator in a conventional low-current low-noise block can be eliminated.

The above-described embodiments of the present invention are intended to be illustrative only. Those skilled in the art may devise numerous alternative embodiments without departing from the scope of the following claims.

What is claimed is:
1. A low-noise block, comprising:
   a low-noise amplifier configured to amplify a received high-band signal;
   at least one local oscillator configured to generate a local-frequency signal;
   at least one mixer configured to mix the local-frequency signal and the received high-band signal into an intermediate-frequency signal;
   at least one IF-amplifier configured to amplify the intermediate-frequency signal; and
   at least one regulator coupled to the IF-amplifier to provide a regular voltage or current to the low-noise amplifier and the local oscillator;
   wherein the DC voltage input of the local oscillator and the DC voltage input of the low-noise amplifier are coupled to a common node and the electrical DC current output of the IF-amplifier is directly coupled to this common node.
2. The low-noise block of claim 1, wherein the common node is AC grounded via a capacitance.
3. The low-noise block of claim 1, wherein a node where the voltage input of the IF-amplifier is coupled to an output terminal of the regulator is AC grounded via a capacitance.
4. The low-noise block of claim 1, wherein the voltage input of the IF-amplifier is AC grounded via a capacitance.
5. The low-noise block of claim 1, wherein the voltage input of the low-noise amplifier is AC grounded via a capacitance.

6. The low-noise block of claim 1, wherein the voltage input of the regulator is coupled to the output terminal of the IF-amplifier via a radio-frequency (RF) choke.

7. The low-noise block of claim 1, further comprising an application-specific integrated circuit (ASIC) coupled between the common node and the IF-amplifier to provide a bias voltage to the low-noise amplifier and the local oscillator.

8. A low-noise block with multiple outputs, comprising:
a first low-noise block according to claim 1, configured to receive a vertical phase component of an input signal;
a second low-noise block according to claim 1, configured to receive a horizontal phase component of the input signal; and
a switch circuit, wherein its input nodes are directly coupled to the electrical DC current output terminals of the IF-amplifiers of the first and second low-noise blocks, respectively, to provide the output signals.

9. The low-noise block of claim 8, which further comprises two output lines.

10. The low-noise block of claim 9, wherein the switch circuit is a four-input-two-output switch.

11. The low-noise block of claim 8, which further comprises four output lines.

12. The low-noise block of claim 9, wherein the switch circuit comprises two four-input-two-output switches.

13. A low-noise block, comprising:
a low-noise amplifier configured to amplify a received high-band signal;
at least one local oscillator configured to generate a local-frequency signal;
at least one mixer configured to mix the local-frequency signal and the received high-band signal into an intermediate-frequency signal;
at least one IF-amplifier configured to amplify the intermediate-frequency signal; and
at least one regulator coupled to the low-noise amplifier to provide a regular voltage or current to the IF-amplifier and the local oscillator;
wherein the DC voltage input of the local oscillator and the DC voltage input of the IF-amplifier are coupled to a common node and the electrical DC current output of the low-noise amplifier is directly coupled to this common node.

14. The low-noise block of claim 13, wherein the common node is AC grounded via a capacitance.

15. The low-noise block of claim 13, wherein a node where the voltage input of the low-noise amplifier coupling to the output terminal of the regulator is AC grounded via a capacitance.

16. The low-noise block of claim 13, wherein the voltage input of the local oscillator is AC grounded via a capacitance.

17. The low-noise block of claim 13, wherein the voltage input of the IF-amplifier is AC grounded via a capacitance.

18. The low-noise block of claim 13, wherein an input terminal of the regulator is coupled to a voltage output terminal of the IF-amplifier via a radio-frequency (RF) choke.

* * * * *